US012785357B2

(12) United States Patent
Chen et al.

(10) Patent No.: US 12,785,357 B2
(45) Date of Patent: Nov. 3, 2026

(54) ELECTRO-ABSORPTION MODULATOR AND ELECTRO-ABSORPTION MODULATED LASER MODULE

(71) Applicant: NATIONAL SUN YAT-SEN UNIVERSITY, Kaohsiung City (TW)

(72) Inventors: Bo-Hong Chen, Kaohsiung City (TW); Yi-Jen Chiu, Kaohsiung City (TW); Chung-Wei Hsiao, Kaohsiung City (TW); Chen-Yu Yeh, Kaohsiung City (TW); Rih-You Chen, Kaohsiung City (TW); Wei Lin, Kaohsiung City (TW)

(73) Assignee: NATIONAL SUN YAT-SEN UNIVERSITY, Kaohsiung City (TW)

( * ) Notice: Subject to any disclaimer, the term of this patent is extended or adjusted under 35 U.S.C. 154(b) by 200 days.

(21) Appl. No.: 18/815,904

(22) Filed: Aug. 27, 2024

(65) Prior Publication Data

US 2026/0011976 A1 Jan. 8, 2026

(30) Foreign Application Priority Data

Jul. 3, 2024 (TW) ................................ 113124925

(51) Int. Cl.
*H01S 5/026* (2006.01)
*G02F 1/01* (2006.01)
*G02F 1/015* (2006.01)
*G02F 1/225* (2006.01)
*H01S 5/12* (2021.01)

(52) U.S. Cl.
CPC .......... *H01S 5/0265* (2013.01); *G02F 1/0121* (2013.01); *G02F 1/0157* (2021.01); *G02F 1/2255* (2013.01); *H01S 5/12* (2013.01)

(58) Field of Classification Search
CPC ........ H01S 5/0265; H01S 5/12; G02F 1/0121; G02F 1/0157; G02F 1/2255
See application file for complete search history.

(56) References Cited

U.S. PATENT DOCUMENTS

2006/0115197 A1 6/2006 Choi
2016/0202501 A1* 7/2016 Bach ........................ G02F 1/015 385/2
2022/0082874 A1* 3/2022 Kaikkonen ........... H01S 5/0265
2023/0006414 A1* 1/2023 Asakura ................ H01S 5/0265

FOREIGN PATENT DOCUMENTS

CN 106980189 A 7/2017

OTHER PUBLICATIONS

High-speed electro-absorption modulator integrated DFB laser using traveling-wave electrodes by Chen-Yu Yeh et al., 2023 IEEE Photonics Conference (IPC).

* cited by examiner

*Primary Examiner* — Christina Y. Leung
(74) *Attorney, Agent, or Firm* — WPAT. PC

(57) ABSTRACT

An electro-absorption modulator includes an optical waveguide element, a first microstrip line, a second microstrip line, and a termination resistor. The optical waveguide element includes an optical channel configured to transmit an optical wave. The first microstrip line is disposed on an upper surface of the optical waveguide element and connected to a microwave signal source to feed-in a microwave signal. The second microstrip line is disposed on the upper surface of the optical waveguide element and spaced from the first microstrip line. The termination resistor is connected to the second microstrip line. An electro-absorption modulated laser module including the electro-absorption modulator is also disclosed.

11 Claims, 5 Drawing Sheets

ELECTRO-ABSORPTION MODULATOR AND ELECTRO-ABSORPTION MODULATED LASER MODULE

CROSS REFERENCE TO RELATED APPLICATION

The application claims the benefit of Taiwan application serial No. 113124925, filed on Jul. 3, 2024, and the entire contents of which are incorporated herein by reference.

BACKGROUND OF THE INVENTION

1. Field of the Invention

The present invention relates to an opto-electronic integration (OEIC) and, more particularly, to an electro-absorption modulator (EAM) and an electro-absorption modulated laser module.

2. Description of the Related Art

In recent years, to develop the next-generation optical network application and manufacture a semiconductor laser module integrated on a chip, increasingly high requirements are imposed on costs and yields of the manufacturing process. Therefore, the conventional semiconductor laser module cannot meet the requirements of the next-generation optical network application.

For example, to ensure that an electro-absorption modulator and a laser emitter have good performance such as a high output power and an excellent high frequency response, the conventional electro-absorption modulated laser module requires more processes and more complicated etching patterns in the manufacturing process.

In view of this, it is necessary to improve the conventional semiconductor laser module.

SUMMARY OF THE INVENTION

To solve the above problems, it is an objective of the present invention to provide an electro-absorption modulator, which can reduce complexity and costs of the manufacturing process while achieving a high output power and an excellent high frequency response.

It is another objective of the present invention to provide an electro-absorption modulated laser module, which can reduce complexity and costs of the manufacturing process while achieving a high output power and an excellent high frequency response.

As used herein, the term “a”, “an” or “one” for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

An electro-absorption modulator of the present invention includes an optical waveguide element, a first microstrip line, a second microstrip line, and a termination resistor. The optical waveguide element includes an optical channel configured to transmit an optical wave. The first microstrip line is disposed on an upper surface of the optical waveguide element. The first microstrip line is connected to a microwave signal source and configured to feed-in a microwave signal. The second microstrip line is disposed on the upper surface of the optical waveguide element and spaced from the first microstrip line. The second microstrip line is configured to be grounded. The termination resistor is connected to the second microstrip line.

Accordingly, in the electro-absorption modulator of the present invention, the first microstrip line and the second microstrip line may be arranged on the upper surface of the optical waveguide element, thereby effectively reducing the complexity and costs of the manufacturing process. In addition, with the optical channel being a buried heterostructure and the second microstrip line connected to the termination resistor, the electro-absorption modulator has a high output power and a good high frequency response.

In an example, the termination resistor has a resistance greater than 30 ohms. Preferably, the termination resistor has a resistance of 50 ohms. Thus, the termination resistor with an appropriate value is selected, so that the microwave signal may be prevented from being reflected by the second microstrip line, and the electro-absorption modulator can have a clearer eye diagram.

In an example, the first microstrip line and the second microstrip line are coplanar. Thus, during manufacturing, the first microstrip line and the second microstrip line may be manufactured in the same process, thereby saving working hours and reducing the difficulty of the manufacturing process.

In an example, the first microstrip line includes a first tip portion and a first tail portion that are integrally formed, and the second microstrip line includes a second tip portion and a second tail portion that are integrally formed. The microwave signal is received from the first tail portion and fed into the optical waveguide element through the first tip portion. The second tail portion is connected to the termination resistor. The optical wave passes through the optical waveguide element along a first direction. The first tip portion and the second tip portion are spaced from each other in a second direction, with the second direction perpendicular to the first direction. Thus, the first tip portion and the second tip portion may be connected to a micro-sized optical waveguide element, and the first tail portion and the second tail portion are suitable for being connected to another photoelectric element due to large areas thereof.

In an example, a spacing between the first tip portion and the second tip portion in the second direction is between 4 micrometers and 6 micrometers. Thus, the spacing is a width of the optical waveguide, so that equivalent capacitance and equivalent inductance may be changed, achieving the effect of bandwidth modulation.

In an example, a spacing between an end of the first tail portion and an end of the second tail portion in the second direction is between 227.4 micrometers and 231.4 micrometers. Thus, the spacing is a cavity length of the electro-absorption modulator, so that microwave loss and equivalent capacitance and equivalent inductance may be affected, achieving the effect of bandwidth modulation.

In an example, widths of the first microstrip line and the second microstrip line gradually change from 13.5-15.5 micrometers at the first and the second tip portions to 36-39 micrometers at the first and the second tail portions. Thus, an area of each of the first microstrip line and the second microstrip line may be changed by the width, thereby adjusting the impedance of a circuit, achieving the effect of adjusting impedance matching.

In an example, the optical channel is an optical waveguide. Thus, the coupling efficiency of light may be effectively improved, and a size of the optical waveguide may be reduced.

An electro-absorption modulated laser module of the present invention includes a substrate, a laser emitter, the electro-absorption modulator as described above, a high reflection layer, and an anti-reflection layer. The laser emitter is disposed on the substrate to generate laser light in an optical channel. The electro-absorption modulator is disposed on the substrate. The high reflection layer is disposed on an end of the laser emitter away from the electro-absorption modulator. The anti-reflection layer is disposed on an end of the electro-absorption modulator away from the laser emitter. The laser light is emitted from the anti-reflection layer to outside of the laser module. The optical channel of the laser emitter and the optical channel of the electro-absorption modulator are in communication with each other in the first direction. An electrode of the laser emitter is insulated from the first microstrip line and the second microstrip line.

Accordingly, in the electro-absorption modulated laser module of the present invention, the first microstrip line and the second microstrip line may be arranged on the upper surface of the optical waveguide element, thereby effectively reducing the complexity and costs of the manufacturing process.

In an example, the laser emitter is a distributed feedback (DFB) Bragg grating laser. Thus, the electro-absorption modulated laser module may be conveniently modulated.

In an example, the first microstrip line is disposed closer to the laser emitter than the second microstrip line. Thus, the microwave signal and an optical signal may be outputted in the same direction, thereby having better high frequency response.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
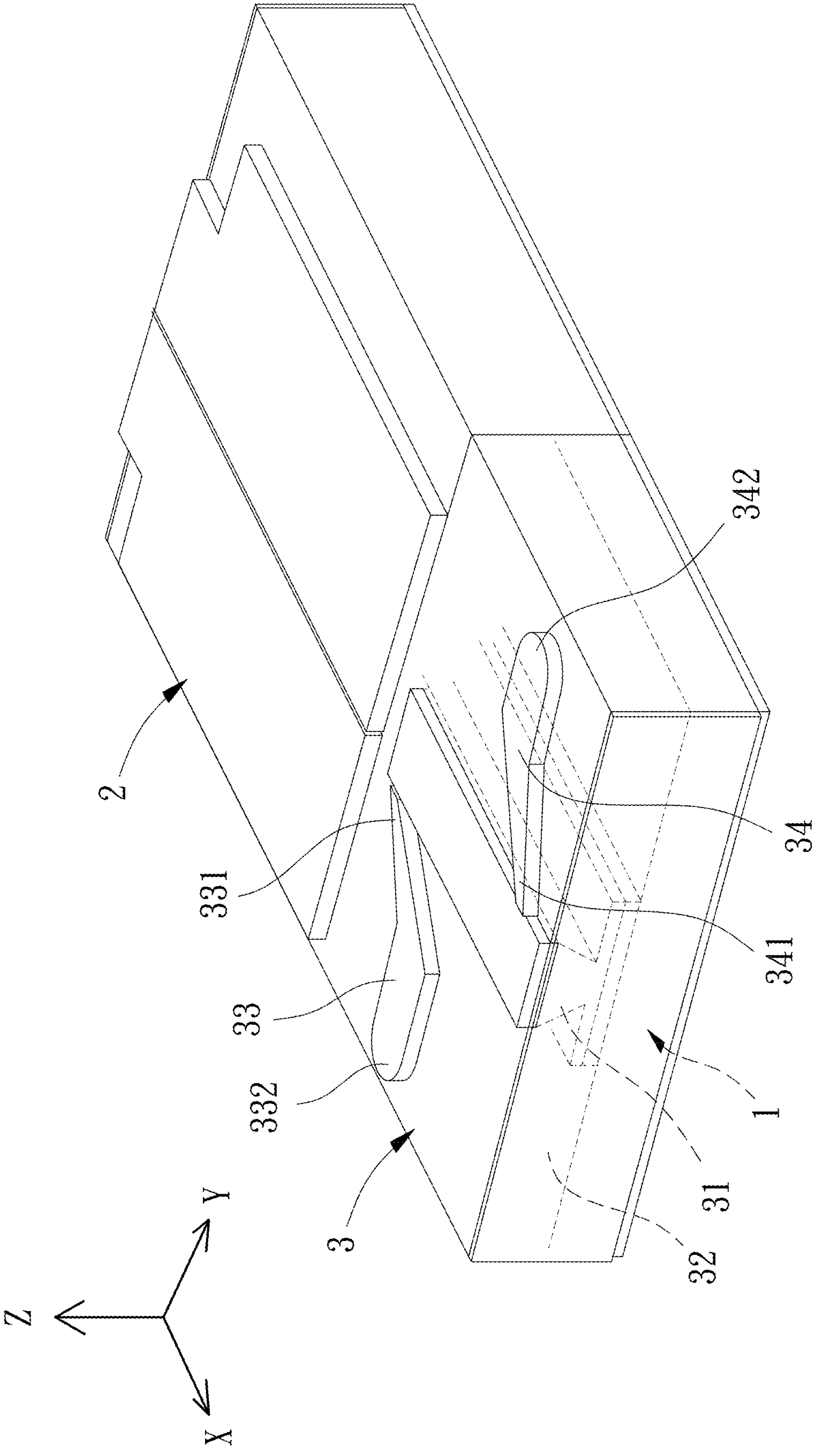
FIG. 1 is a perspective view of a preferred embodiment of an electro-absorption modulated laser module according to the present invention.

When the terms “front”, “rear”, “left”, “right”, “up”, “down”, “top”, “bottom”, “inner”, “outer”, “side”, and similar terms are used herein, it should be understood that these terms have reference only to the structure shown in the drawings as it would appear to a person viewing the drawings and are utilized only to facilitate describing the invention, rather than restricting the invention.

DETAILED DESCRIPTION OF THE INVENTION

In order to make the above and other objectives, features, and advantages of the present invention clearer and easier to understand, preferred embodiments of the present invention will be described hereinafter in connection with the accompanying drawings. Furthermore, the elements designated by the same reference numeral in various figures will be deemed as identical, and the description thereof will be omitted.

Figure 2:
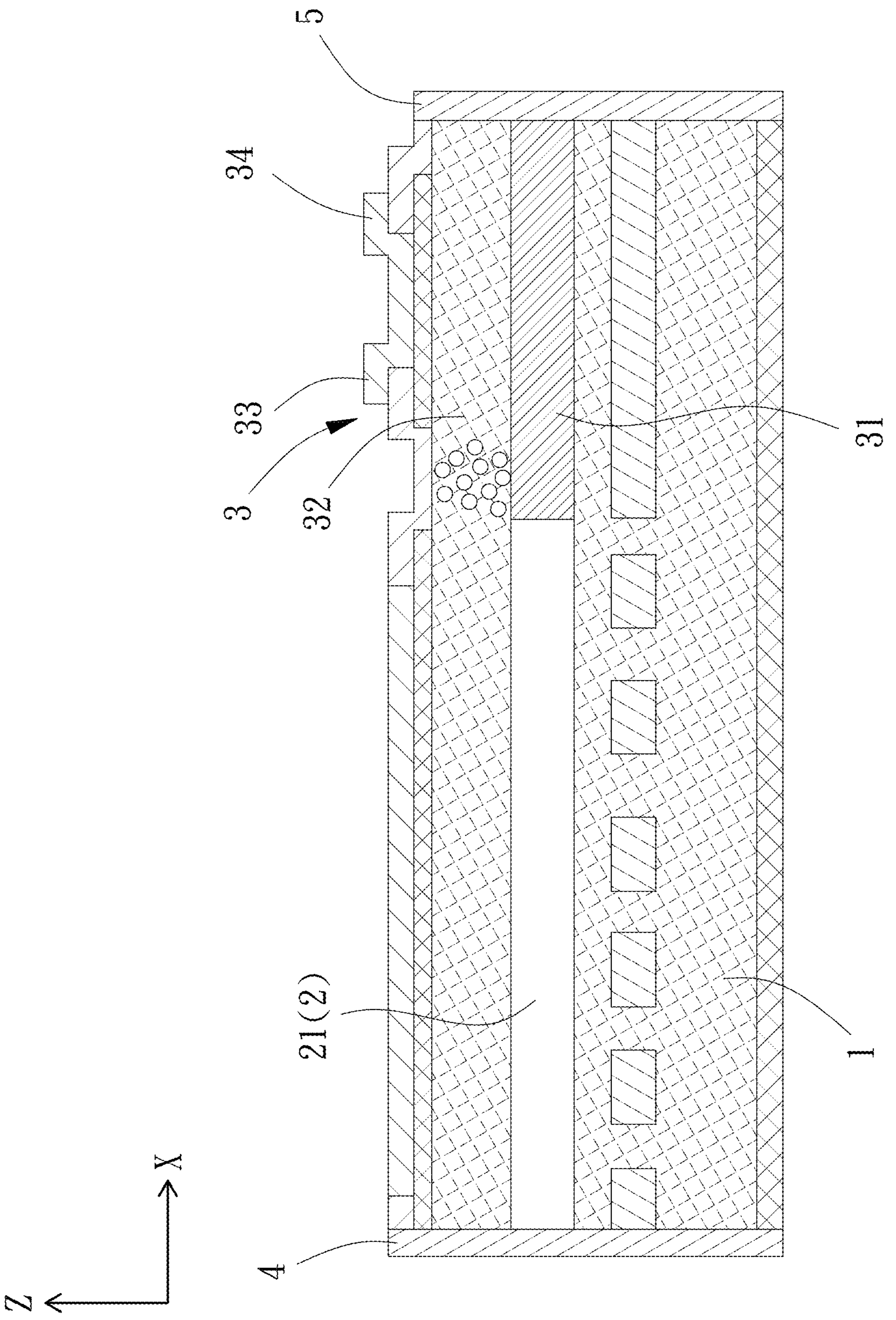
FIG. 2 is a cross-sectional view of stacked layers of the preferred embodiment of the electro-absorption modulated laser module according to the present invention.

Referring to FIGS. 1 and 2, an embodiment of an electro-absorption modulated laser module of the present invention includes a substrate 1, a laser emitter 2, an electro-absorption modulator 3, a high reflection layer 4, and an anti-reflection layer 5. The laser emitter 2 is disposed on the substrate 1 to generate laser light in an optical channel 21. The electro-absorption modulator 3 is disposed on the substrate 1. An optical channel 31 of the electro-absorption modulator 3 communicates with the optical channel 21 of the laser emitter 2 in a first direction X. The high reflection layer 4 is disposed on an end of the laser emitter 2 away from the electro-absorption modulator 3. The anti-reflection layer 5 is disposed on an end of the electro-absorption modulator 3 away from the laser emitter 2. The laser light is emitted from the anti-reflection layer 5 to outside of the laser module.

Figure 3:
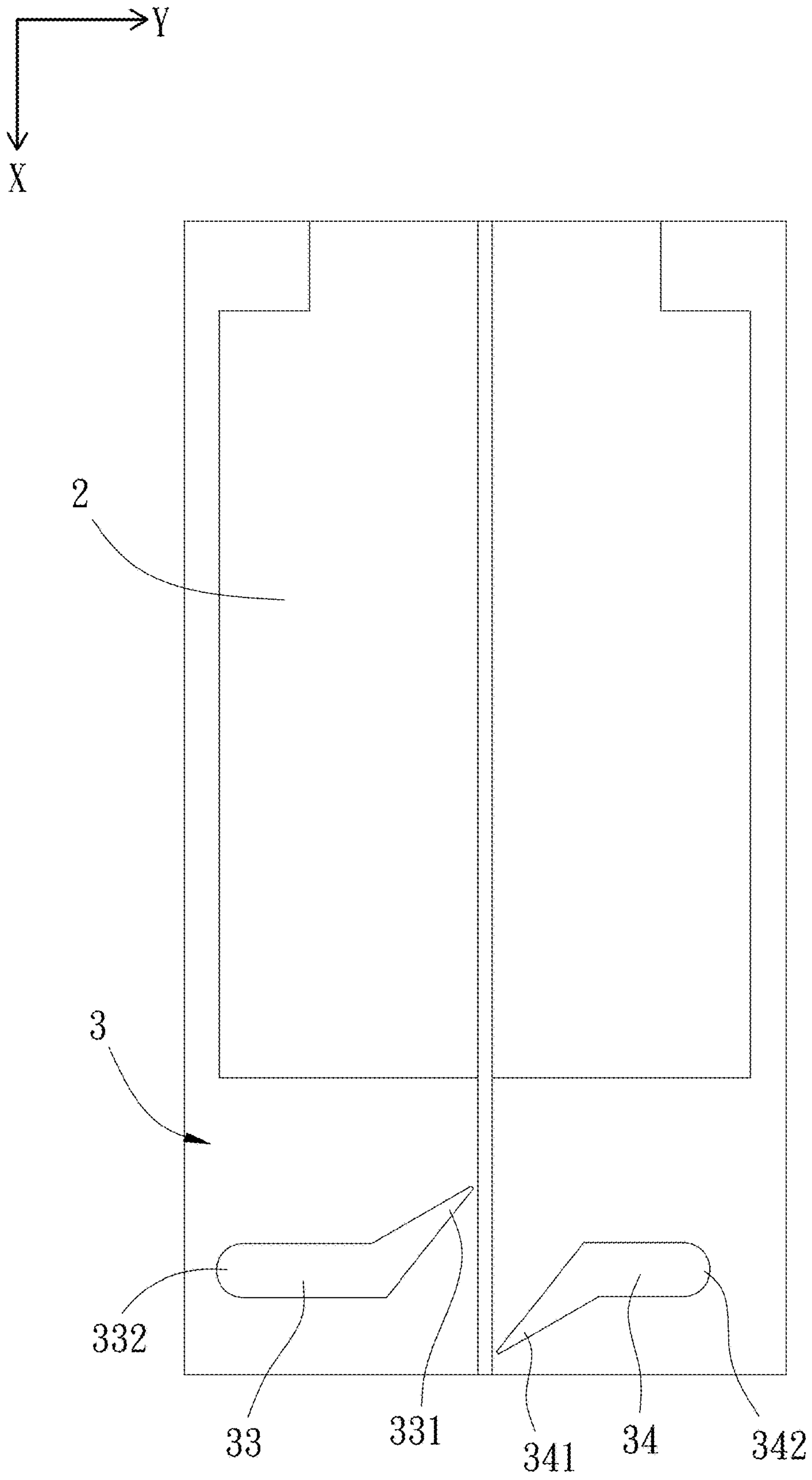
FIG. 3 is a top view of the preferred embodiment of the electro-absorption modulated laser module according to the present invention.

It should be noted that a Cartesian coordinate system is used in FIGS. 1 to 3 for illustrating the geometrical relationship of elements of the electro-absorption modulated laser module.

A material of the substrate 1 may be selected based on actual needs. For example, the substrate 1 may include a group III-V semiconductor material. In this example, indium phosphide (InP) may be used as the material of the substrate 1. However, a group II-VI semiconductor material may also be used as the material of the substrate 1 as needed. As a result, materials, structures, and positions of other elements of the electro-absorption modulated laser module, such as an N-Cladding layer, a P-Cladding layer, an active layer, and a passivation layer, may be modified accordingly. For example, the high reflection layer 4 and the anti-reflection layer 5 may be modified corresponding to optical properties caused by the materials, the structures, and the positions of the foregoing elements without departing from the spirit of the present invention.

In an example of the substrate 1, chemical plating may be performed on the substrate 1 to grind the wafer to 100 micrometers, thereby enhancing heat dissipation of the electro-absorption modulated laser module.

In an embodiment, the laser emitter 2 is a distributed feedback Bragg grating laser (a DFB laser) to improve accuracy and stability of optical fiber communication.

In an embodiment, a grating of the laser 2 is formed by growing indium gallium arsenide phosphide (InGaAsP), as a material of the grating, on an InP substrate through metal-organic chemical vapor deposition (MOCVD), defining the grating in a specific region by using an E-beam photoresist and an E-beam writer, and etching to a specific thickness.

An active layer of the laser emitter 2 may be a multiple quantum well, and the material and the structure thereof may be adjusted based on factors such as the required wavelength and the substrate material. In this embodiment, a length of the active layer of the laser emitter 2 in the first direction X is 150 micrometers, and a length of the electro-absorption modulator 3 in the first direction X is between 90 micrometers and 150 micrometers. By controlling a bias current of the laser emitter 2 between 20 mA and 70 mA, laser light with wavelengths between 1328.5 nm and 1330 nm may be outputted.

In an embodiment, an N-Cladding layer and an N-Cladding layer side electrode of the laser emitter 2 have a structure in which gold-germanium alloy, nickel, gold, titanium, platinum, and gold are disposed in layers, and thicknesses thereof are respectively 300 nm, 200 nm, 500 nm, 500 nm, 500 nm, 500 nm, and 3000 nm. A P-Cladding layer and a P-Cladding layer side electrode of the laser emitter 2 have a structure in which titanium, platinum, and gold are disposed in layers, and thicknesses thereof are respectively 500 nm, 500 nm, and 5000 nm. After the N-Cladding layer and the N-Cladding layer side electrode are formed, annealing may be performed to form ohmic contact between a metal layer and a semiconductor, and the same is performed after the P-Cladding layer and the P-Cladding layer side electrode are formed.

However, the arrangement of each of the N-Cladding layer, the N-Cladding layer side electrode, the P-Cladding layer, and the P-Cladding layer side electrode of the laser emitter 2 described above may be adjusted based on the structures of the active layer, the substrate 1, and so on. For example, in a case that the N-Cladding layer and the N-Cladding layer side electrode of the laser emitter 2 are close to the bottom of the substrate 1, the N-Cladding layer and the N-Cladding layer side electrode have a structure in which gold-germanium alloy, nickel, gold, titanium, platinum, and gold are arranged in a negative direction against a third direction Z. In this case, the P-Cladding layer and the P-Cladding layer side electrode have a structure in which titanium, platinum, and gold are arranged in a positive direction along the third direction Z. In a case that the P-Cladding layer and the P-Cladding layer side electrode of the laser emitter 2 are close to the bottom of the substrate 1, the P-Cladding layer and the P-Cladding layer side electrode have a structure in which titanium, platinum, and gold are arranged in the negative direction against the third direction Z, and the N-Cladding layer and the N-Cladding layer side electrode have a structure in which gold-germanium alloy, nickel, gold, titanium, platinum, and gold are arranged in the positive direction along the third direction Z.

In an embodiment of the P-Cladding layer and P-Cladding layer side electrode of the laser emitter 2, silicon nitride (SiNx) is deposited through plasma enhanced chemical vapor deposition (PECVD), ICP dry etching is performed until a contact layer of InGaAs is exposed, and then the P-Cladding layer and P-Cladding layer side electrode are evaporated by an electron gun (E-gun).

In an embodiment of an intermediate region between the laser emitter 2 and the electro-absorption modulator 3, a contact layer is removed from the intermediate region between the laser emitter 2 and the electro-absorption modulator 3 through a solution containing sulfuric acid, hydrogen peroxide, and water, thereby avoiding cross talk between signals.

The optical channel 21 of the laser emitter 2 and the optical channel 31 of the electro-absorption modulator 3 are both buried heterostructures (BH) to improve performance and stability of an optical waveguide. More specifically, the optical channel 21 of the laser emitter 2 and the optical channel 31 of the electro-absorption modulator 3 are both reversed ridge waveguides. In this way, the coupling efficiency of light may be effectively improved, and the size of the optical waveguide may be reduced.

Figure 4:
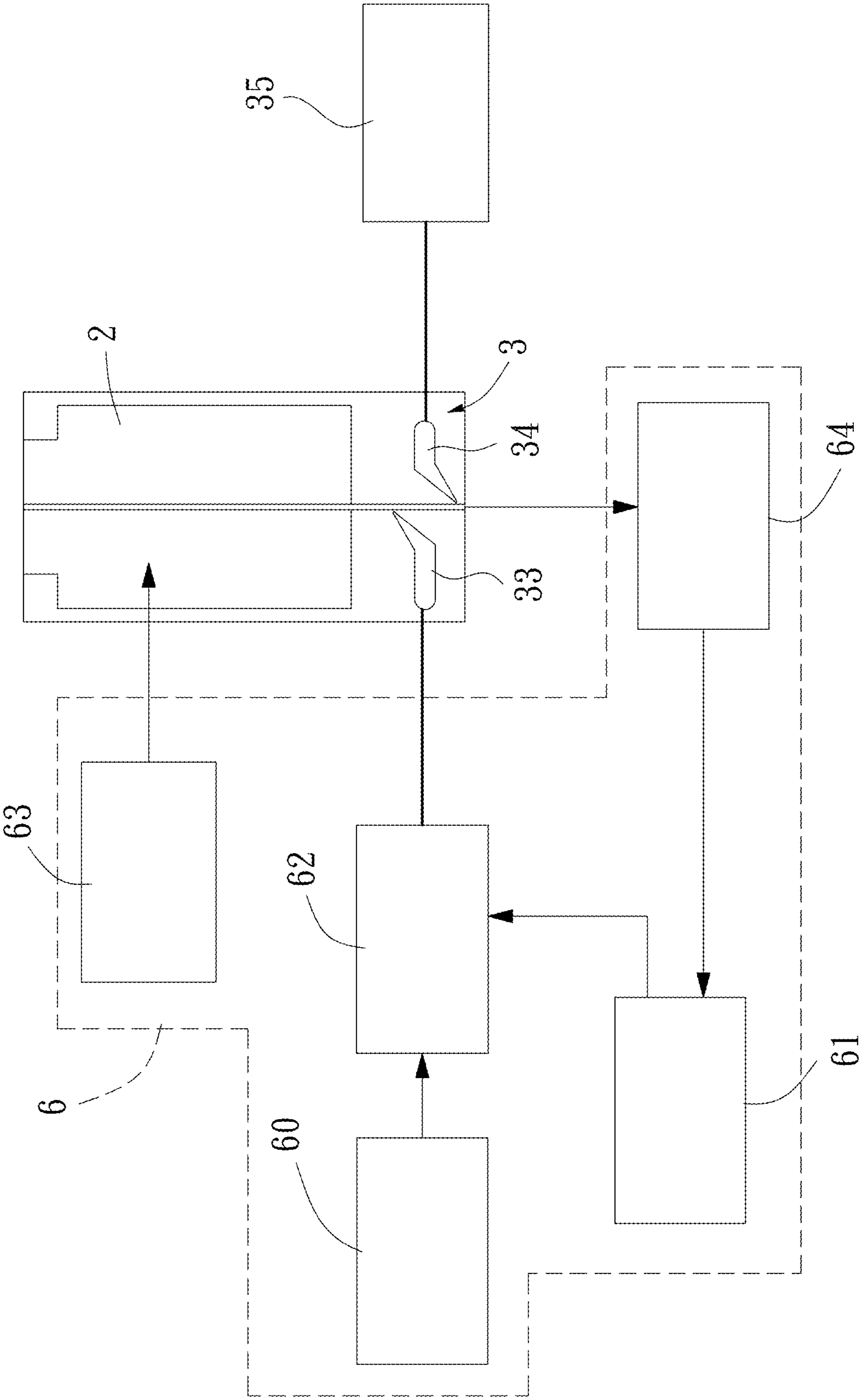
FIG. 4 is a system block diagram of the electro-absorption modulated laser module according to the present invention for measurement.

Referring to FIGS. 2 and 3, the electro-absorption modulator 3 of the present invention includes an optical waveguide element 32, a first microstrip line 33, a second microstrip line 34, and a termination resistor 35 (as shown in FIG. 4). The optical waveguide element 32 includes the optical channel 31. The optical channel 31 is configured to transmit light along the first direction X and is a buried heterostructure. The first microstrip line 33 is disposed on an upper surface of the optical waveguide element 32. The first microstrip line 33 is connected to an external microwave signal source, and is configured to feed-in a microwave signal. The second microstrip line 34 is disposed on the upper surface of the optical waveguide element 32 and is spaced from the first microstrip line 33. The second microstrip line 34 is configured to be grounded, and the termination resistor 35 is connected to the second microstrip line 34.

Therefore, the laser light emitted from the optical channel 21 of the laser emitter 2 enters the optical channel 31 of the electro-absorption modulator 3. The electro-absorption modulator 3 may transmit laser light of a selected wavelength in the optical channel 31, so that the laser light of the selected wavelength is emitted from the anti-reflection layer 5 to the outside of the electro-absorption modulated laser module. Alternatively, the electro-absorption modulator 3 may absorb the laser light of the selected wavelength in the optical channel 31 to adjust the intensity of the laser light of the selected wavelength. In addition, an electric field may be changed by adjusting the microwave signal applied to the electro-absorption modulator 3, and then the intensity of the laser light may be adjusted, thereby transmitting and processing data.

As a result, in the electro-absorption modulator 3 of the present invention, both of the first microstrip line 33 and the second microstrip line 34 may be disposed on the upper surface of the optical waveguide element 32, thereby effectively reducing the complexity and costs of the manufacturing process and increasing the yield. It is worth noting that with the optical channel 31 being a buried heterostructure, the electro-absorption modulator 3 has a high output power and a better high frequency response. Furthermore, the second microstrip line 34 is connected to the termination resistor 35, so that the electro-absorption modulator 3 has better performance.

In an embodiment, the first microstrip line 33 and the second microstrip line 34 are coplanar. In this way, during the manufacturing, the first microstrip line 33 and the second microstrip line 34 may be manufactured in the same process, thereby saving working hours and reducing difficulty of the manufacturing process.

The first microstrip line 33 includes a first tip portion 331 and a first tail portion 332 that are integrally formed, and the second microstrip line 34 includes a second tip portion 341 and a second tail portion 342 that are integrally formed. The microwave signal is received from the first tail portion 332 and fed into the optical waveguide element 32 through the first tip portion 331. The second tail portion 342 is connected to the termination resistor 35. The first tip portion 331 and the second tip portion 341 are spaced from each other in a second direction Y, with the second direction Y perpendicular to the first direction X. In this way, the first tip portion 331 and the second tip portion 341 may be connected to a micro-sized optical waveguide element 32, and the first tail portion 332 and the second tail portion 342 are suitable for being connected to another photoelectric element due to large areas thereof.

Moreover, shapes of the first microstrip line 33 and the second microstrip line 34 are similar but not identical to each other. The microwave signal enters through the first tail portion 332 of a fixed width, and then is fed through the first tip portion 331 (a feeding line) with a gradually changing width and inputted into the optical waveguide element 32 at an angle of 45 degrees with the second direction Y. The microwave signal is then outputted to the second tip portion 341 at an angle of 45 degrees with the second direction Y, passes through the second tip portion 341 with a gradually changing width, and then is outputted through the second tail portion 342 (a loaded line) of a fixed width.

A spacing between the first tip portion 331 and the second tip portion 341 in the second direction Y is between 4 micrometers and 6 micrometers. The spacing is a width of the optical channel 31 in the second direction Y. Since a degree of opening of the first tip portion 331 and the second tip portion 341 in the second direction Y affects the equivalent capacitance and the equivalent inductance, the spacing between the first tip portion 331 and the second tip portion 341 in the second direction Y affects the bandwidth modulation. Furthermore, the spacing between the end of the first tail portion 332 and the end of the second tail portion 342 in the second direction Y is between 227.4 micrometers and 231.4 micrometers.

In addition, the spacing between the first tip portion 331 and the second tip portion 341 in the first direction X is a cavity length of the electro-absorption modulator 3. When the cavity length of the electro-absorption modulator 3 is reduced, the equivalent capacitance, the equivalent inductance, and microwave loss all decrease, thereby widening the adjustable bandwidth.

A width of the first microstrip line 33 in the first direction X gradually changes from 13.5-15.5 micrometers at the first tip portion 331 to 36-39 micrometers at the first tail portion 332. A width of the second microstrip line 34 in the first direction X gradually changes from 13.5-15.5 micrometers at the second tip portion 341 to 36-39 micrometers at the second tail portion 342. Impedance matching with the termination resistor 35 may be adjusted by adjusting a width of the second tail portion 342. Preferably, the width of the second tail portion 342 in the first direction X is 38 micrometers, so that the second tail portion 342 achieves the impedance matching of 50 ohms with the termination resistor 35.

Please refer to FIG. 4, which is a system block diagram of a measurement system for measuring microwave penetration loss according to the present invention. A measurement system 6 sends the microwave signal through a vector network analyzer (VNA) 61, and generates, as a bias current driving the electro-absorption modulator 3, the microwave signal fed into the electro-absorption modulator 3 by mixing a direct current signal outputted by a laser diode driver in constant current mode (LD CC) through a bias tee 62. The bias tee 62 is connected to an external power supply 60. A laser driving unit 63 provides an alternating current signal to drive the laser emitter 2, so that the electro-absorption modulated laser module generates laser light. The laser light is coupled using a tapered fiber, and an optical attenuator is used to reduce the output power to a power suitable for a photodetector 64 (photodiode, PD). Finally, the photodetector 64 converts the received optical signal into an electrical signal and feeds the electrical signal back to the VNA 61 to analyze a response frequency of laser. The bias current of the electro-absorption modulator 3 may be modulated by fine-tuning the microwave signal.

Figure 5:
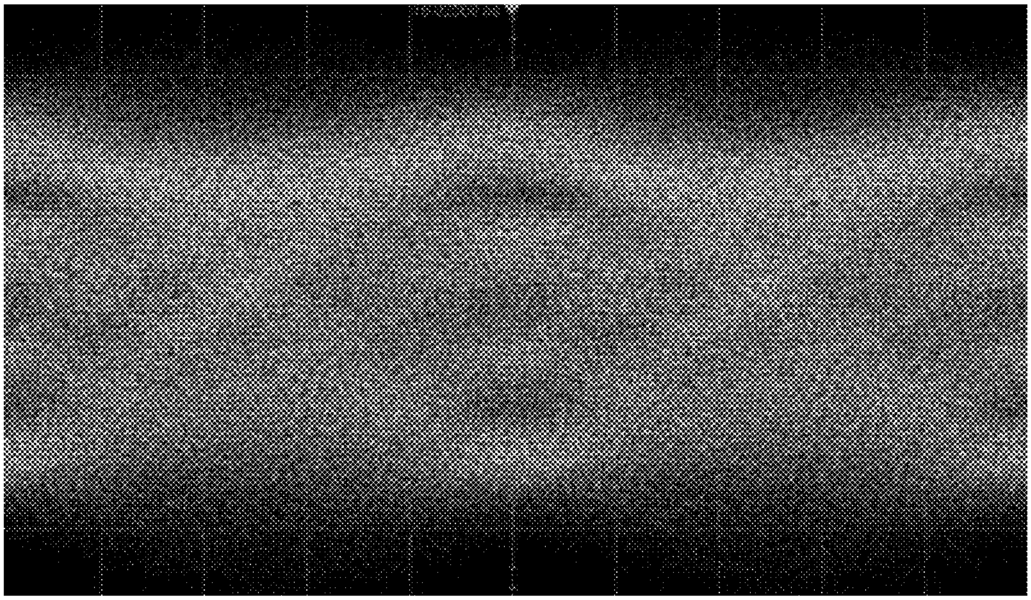
FIG. 5 is a frequency response diagram of the electro-absorption modulated laser module according to the present invention with no termination resistor being connected.
Figure 6:
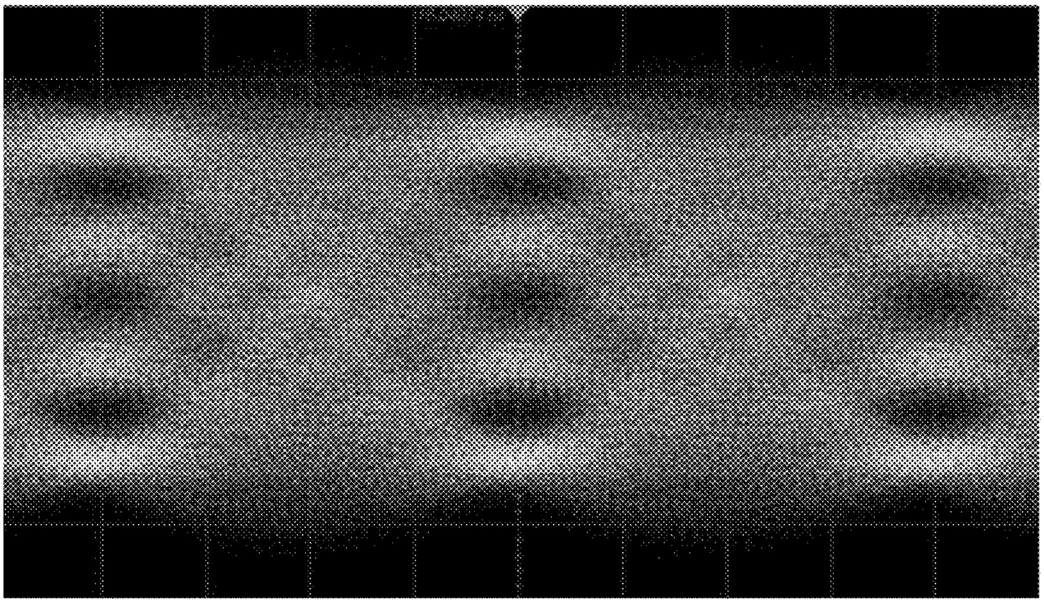
FIG. 6 is a frequency response diagram of the electro-absorption modulated laser module according to the present invention with a termination resistor being connected.

In an embodiment, the termination resistor 35 may have a resistance greater than 30 ohms. Preferably, the termination resistor 35 may have a resistance of 50 ohms. Referring to FIGS. 5 and 6, by selecting the termination resistor 35 with an appropriate value, the microwave signal may be prevented from being reflected by the second microstrip line 34, and the electro-absorption modulator 3 can have a clearer eye diagram. FIG. 5 shows an eye diagram with no termination resistor 35 being connected, and FIG. 6 shows an eye diagram with the termination resistor 35 being connected and the resistance being 50 ohms. Regarding the eye diagram, a larger eye width indicates higher fault tolerance, a larger eye height indicates better amplitude stability of a signal, a smaller center offset indicates better synchronization, and less jittering indicates higher signal stability. In the present invention, the eye diagram has less jittering and relatively large eye height, which indicate good signal stability.

The anti-reflection layer 5 may control an output direction of the laser light and reduce reflection to increase a light output power. A frequency bandwidth of the laser light may be changed by fine-tuning a reflectivity of the anti-reflection layer 5.

Based on the above, in the present invention, the first microstrip line and the second microstrip line may be arranged on the upper surface of the optical waveguide element, thereby effectively reducing the complexity and costs of the manufacturing process. In addition, with the optical channel being a buried heterostructure and the second microstrip line connected to the termination resistor, the electro-absorption modulator has a high output power and a good high frequency response.

Although the present invention has been described with respect to the above preferred embodiments, these embodiments are not intended to restrict the present invention. Various changes and modifications on the above embodiments made by any person skilled in the art without departing from the spirit and scope of the present invention are still within the technical category protected by the present invention. Accordingly, the scope of the present invention shall include the literal meaning set forth in the appended claims and all changes which come within the range of equivalency of the claims. Furthermore, in a case that several of the above embodiments can be combined, the present invention includes the implementation of any combination.

What is claimed is:

1. An electro-absorption modulator, comprising:

an optical waveguide element including an optical channel configured to transmit an optical wave, wherein the optical wave passes through the optical waveguide element along a first direction;

a first microstrip line, including a first tip portion and a first tail portion integrally formed, disposed on an upper surface of the optical waveguide element, wherein the first microstrip line is connected to a microwave signal source and configured to feed-in a microwave signal, and the microwave signal is received from the first tail portion and fed into the optical waveguide element through the first tip portion;

a second microstrip line, including a second tip portion and a second tail portion integrally formed, disposed on the upper surface of the optical waveguide element and spaced from the first microstrip line, wherein the second microstrip line is configured to be grounded, wherein the first tip portion and the second tip portion are spaced from each other in a second direction perpendicular to the first direction; and a termination resistor connected to the second tail portion of the second microstrip line.

2. The electro-absorption modulator as claimed in claim 1, wherein the termination resistor has a resistance greater than 30 ohms.

3. The electro-absorption modulator as claimed in claim 2, wherein the termination resistor has a resistance of 50 ohms.

4. The electro-absorption modulator as claimed in claim 1, wherein the first microstrip line and the second microstrip line are coplanar.

5. The electro-absorption modulator as claimed in claim 1, wherein a spacing between the first tip portion and the second tip portion in the second direction is between 4 micrometers and 6 micrometers.

6. The electro-absorption modulator as claimed in claim 1, wherein a spacing between an end of the first tail portion and an end of the second tail portion in the second direction is between 227.4 micrometers and 231.4 micrometers.

7. The electro-absorption modulator as claimed in claim 1, wherein widths of the first microstrip line and the second microstrip line gradually change from 13.5-15.5 micrometers at the first and the second tip portions to 36-39 micrometers at the first and the second tail portions.

8. The electro-absorption modulator as claimed in claim 1, wherein the optical channel is an optical waveguide.

9. An electro-absorption modulated laser module, comprising:

a substrate;

a laser emitter disposed on the substrate to generate laser light in an optical channel;

the electro-absorption modulator as claimed in claim 1, wherein the electro-absorption modulator is disposed on the substrate;

a high reflection layer disposed on an end of the laser emitter away from the electro-absorption modulator; and an anti-reflection layer disposed on an end of the electro-absorption modulator away from the laser emitter, wherein the laser light is emitted from the anti-reflection layer to outside of the laser module, wherein the optical channel of the laser emitter and the optical channel of the electro-absorption modulator are in communication with each other in the first direction, and wherein an electrode of the laser emitter is insulated from the first microstrip line and the second microstrip line.

10. The electro-absorption modulated laser module as claimed in claim 9, wherein the laser emitter is a distributed feedback (DFB) Bragg grating laser.

11. The electro-absorption modulated laser module as claimed in claim 9, wherein the first microstrip line is disposed closer to the laser emitter than the second microstrip line.

* * * * *